United States Patent
Wang et al.

(10) Patent No.: US 6,320,416 B1
(45) Date of Patent: Nov. 20, 2001

(54) INPUT BUFFER MEANS FOR HIGH VOLTAGE OPERATION

(75) Inventors: Ming-Shiang Wang, TaiChung; Tean-Sen Jen, Tao Yuan; C. B. Chen, Taipei; Shih-Hsun Liang, Taipei; Shiou-Yu Wang, Taipei, all of (TW)

(73) Assignee: Nanya Technology Corporation, TaoYuan (TW)

( * ) Notice: Subject to any disclaimer, the term of this patent is extended or adjusted under 35 U.S.C. 154(b) by 0 days.

(21) Appl. No.: 09/289,654

(22) Filed: Apr. 12, 1999

(Under 37 CFR 1.47)

(30) Foreign Application Priority Data

Jun. 26, 1998 (TW) .................................................. 87110327

(51) Int. Cl.[7] .................................................. H03K 19/00
(52) U.S. Cl. .................................. 326/83; 326/86; 326/81
(58) Field of Search .................................. 326/80, 81, 83, 326/86

(56) References Cited

U.S. PATENT DOCUMENTS

| | | | | |
|---|---|---|---|---|
| 4,656,373 | * | 4/1987 | Plus ........................................ | 326/81 |
| 5,414,312 | * | 5/1995 | Wong ..................................... | 326/83 |
| 5,448,198 | * | 9/1995 | Toyashima et al. .................... | 326/81 |
| 5,673,277 | * | 9/1997 | Amitai et al. .......................... | 326/16 |
| 5,764,077 | * | 6/1998 | Andresen et al. ..................... | 326/83 |
| 6,025,737 | * | 2/2000 | Patel et al. ............................ | 326/80 |

* cited by examiner

*Primary Examiner*—Michael Tokar
*Assistant Examiner*—Don Phu Le
(74) *Attorney, Agent, or Firm*—Bacon & Thomas, PLLC

(57) ABSTRACT

An input buffer capable of high voltage operation includes a transmission gate connected to a boosting voltage source. The input buffer can be used to maintain the processing speed and noise margin of a digital circuit even through the input voltage thereof is excessively high. Moreover, the input buffer can be used in an address latch or inverter-type circuit.

9 Claims, 4 Drawing Sheets ically, the dynamic random, access memory (DRAM), generally adopts input buffer means at the input end of the address latch for buffering the input address signal. The address latch is provided with the input buffer to obtain sufficient noise margin for rejecting noise, and fast processing speed. Moreover, the input buffer should ensure the normal function of the address latch and the reliability thereof in case of an input signal having excessive voltage. In other words, the function of the input buffer means is to ensure the performance of the address latch for high-voltage and high-speed input signals.

INPUT BUFFER MEANS FOR HIGH VOLTAGE OPERATION

FIELD OF THE INVENTION

The present invention relates to an input buffer means for high voltage operation, and more particularly, to an input buffer means of a semiconductor memory device, which achieves noise margin and satisfactory performance at a required speed by incorporating a transmission gate.

BACKGROUND OF THE INVENTION

The semiconductor memory integrated circuit, for example, the dynamic random, access memory (DRAM), generally adopts input buffer means at the input end of the address latch for buffering the input address signal. The address latch is provided with the input buffer to obtain sufficient noise margin for rejecting noise, and fast processing speed. Moreover, the input buffer should ensure the normal function of the address latch and the reliability thereof in case of an input signal having excessive voltage. In other words, the function of the input buffer means is to ensure the performance of the address latch for high-voltage and high-speed input signals.

The conventional input buffer means is generally connected to an external voltage source $E_{VCC}$ to increase the allowable range of input signal levels. FIG. 1 shows the block diagram of a conventional input buffer means for an address latch in a semiconductor memory integrated circuit. As shown in this figure, the input buffer has input terminal to receive the input address signal, an output terminal to send the latched address signal. Moreover, the an input buffer means is connected to an external voltage source to prevent malfunction in case of input signal having excessive level.

However, in the above-mentioned input buffer, the processing speed and the signal robustness is degraded when the voltage level of the external voltage source $E_{VCC}$ is reduced, for example, from 5V to 3V. Moreover, the output high level $V_{OH}$ and the noise margin of the input buffer 1 is also degraded such that the output signal thereof may be at a wrong level with respect to next stage circuit.

SUMMARY OF THE INVENTION

The present invention is intended to solve the above problems by providing an input buffer means which has required immunity to the noise of the external voltage source, and outputs a signal with a definite level for the next stage. In another aspect of the invention, the inventive input buffer can be employed in high-speed applications, such as fast page mode operation. Therefore, the inventive input buffer can be advantageously adopted in DRAM design.

It is an object of the present invention to provide an input buffer means for high voltage operation, which can enhance noise margin and sustain a definite $V_{OH}$ even though the voltage of the external voltage source is reduced.

It is another object of the present invention to provide an input buffer for a high speed input signal such that the processing speed will not be degraded even though the voltage of the external voltage source is reduced.

To achieve the above and other objects, the present invention provides an input buffer means having a transmission gate and is suitable for application of a address latch with a wide input signal level. The address latch adopting the inventive input buffer means further comprises a control latch for latching the address data, a reference circuit for providing a reference voltage, and a first and a second output control circuit to drive circuit of next stage.

The transmission gate of the inventive input buffer is preferably connected to a boosting voltage source such that the address latch or other digital circuit equipped with the inventive input buffer has fast processing speed and the capability of high voltage operation, and will not have degraded noise margin when the voltage of the external voltage source is reduced. It should be pointed out that the boosting voltage generator is known to those skilled in the related art, and thus the detailed description thereof is omitted here for clarity.

The transmission gate of the inventive input buffer means is preferably in an inverter-type circuit, wherein the transmission gate is connected to the input terminal of an inverter, and then the output of the inverter is sent to the inverter-type address latch or other digital circuit. Therefore, the inventive input buffer can also achieve the above objects for an inverter-type address latch.

The various objects and advantages of the present invention will be more readily understood from the following detailed description when read in conjunction with the appended drawings, in which:

DETAILED DESCRIPTION OF THE PREFERRED EMBODIMENT

Figure 1:
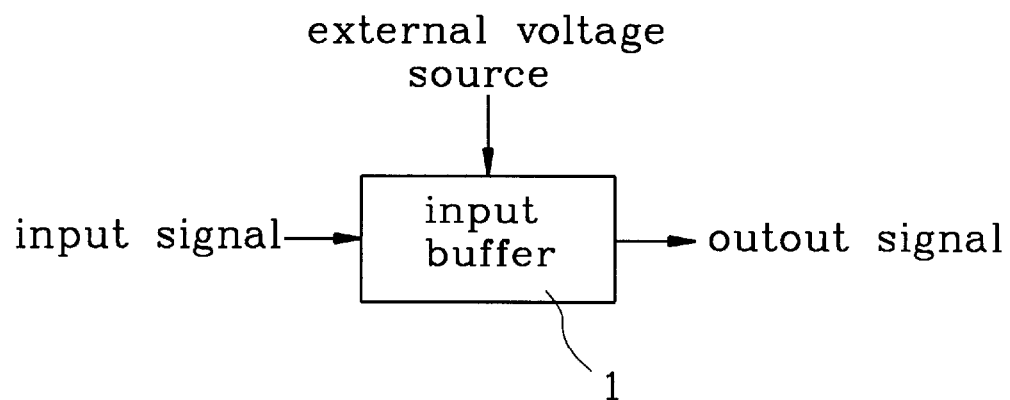
FIG. 1 shows the block diagram of a conventional input buffer.
Figure 2:
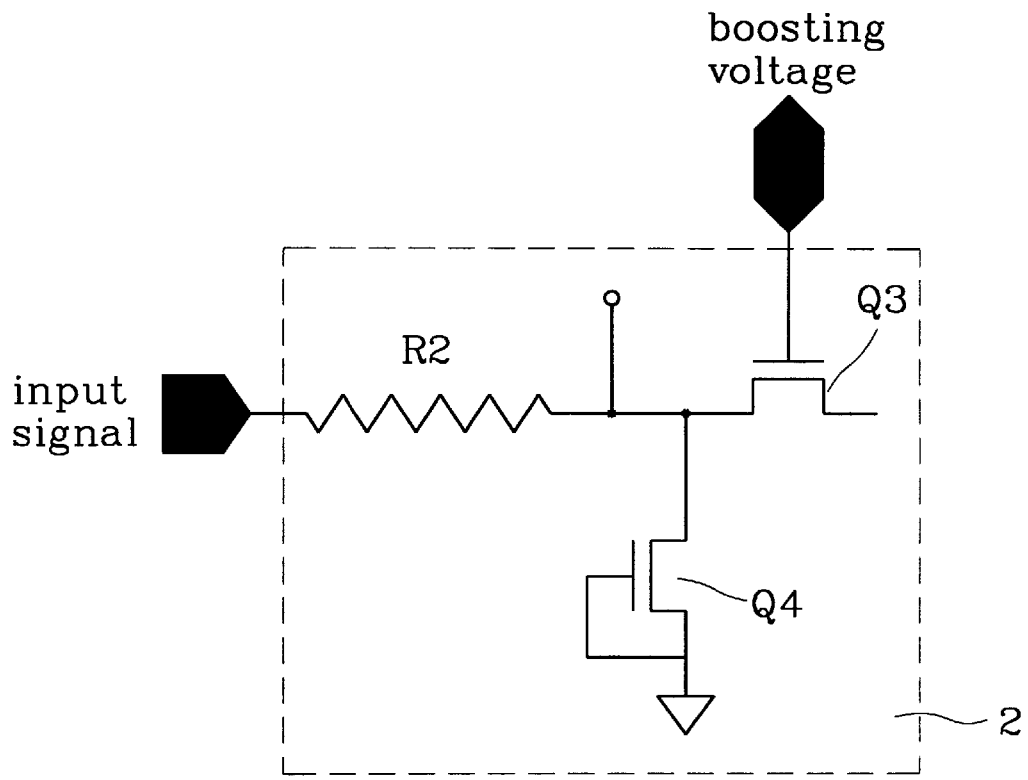
FIG. 2 shows the transmission gate of the input buffer according to the first preferred embodiment of the present invention.

FIG. 2 shows the transmission gate of the input buffer according to the first preferred embodiment of the present invention. The transmission gate 2 comprises a resistor R2 and two transistors Q3 and Q4. The resistor R2 is connected to the input signal at one end thereof, and connected commonly to the sources of the transistors Q3 and Q4 at another end thereof. The gate of the transistor Q3 is connected to a boosting voltage source and the drain thereof functions as an output terminal. Both the drain and gate of the transistor Q4 are grounded. By the provision of the boosting voltage source to the gate of the transistor Q3, the transmission gate 2 is suitable for high input voltage/high speed application, and can provide a sufficient noise margin even though the voltage of the external voltage source is reduced.

Figure 3:
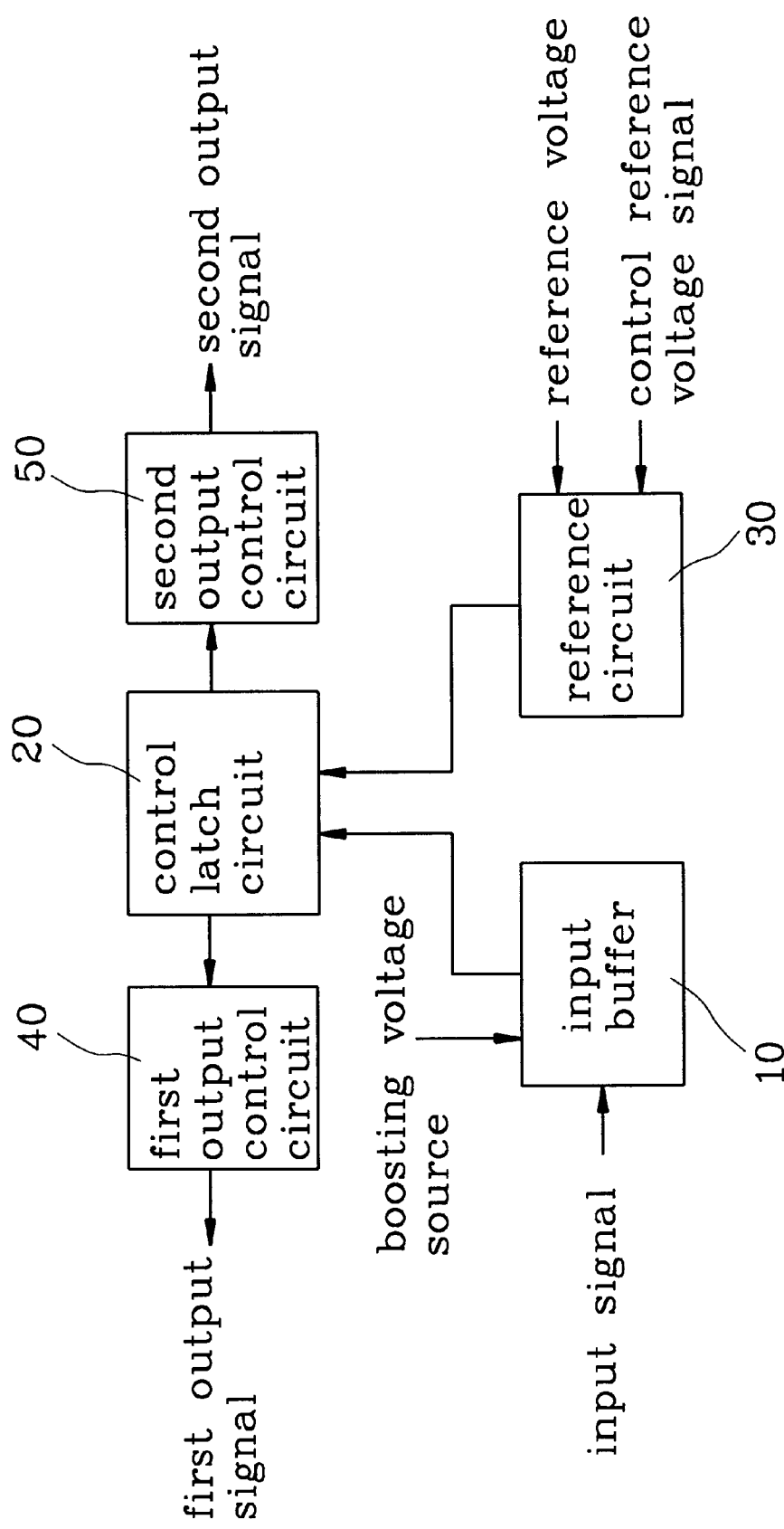
FIG. 3 shows the block diagram of the first preferred embodiment of the present invention.

The feasibility of the inventive transmission gate can be more clearly understood by explaining the application thereof as an address latch input buffer. FIG. 3 shows the block diagram of the first preferred embodiment of the present invention. The address latch comprises an input buffer 10 implemented by the transmission gate shown in FIG. 2, a control latch 20 for latching the address signal, a reference circuit 30 for providing a reference voltage and signal controlling the reference signal, and first and a second output control circuit 40 and 50 for outputting first and second output signals, respectively. More specifically, the input buffer 10 is connected to a boosting voltage source and functions as an input terminal for the address latch. The two input terminals of the control latch 20 are connected to the output of the input buffer 10 and the output of the reference circuit 30, respectively. The outputs of the control latch 20 are connected to the first and a second output control circuit 40 and 50.

Figure 4:
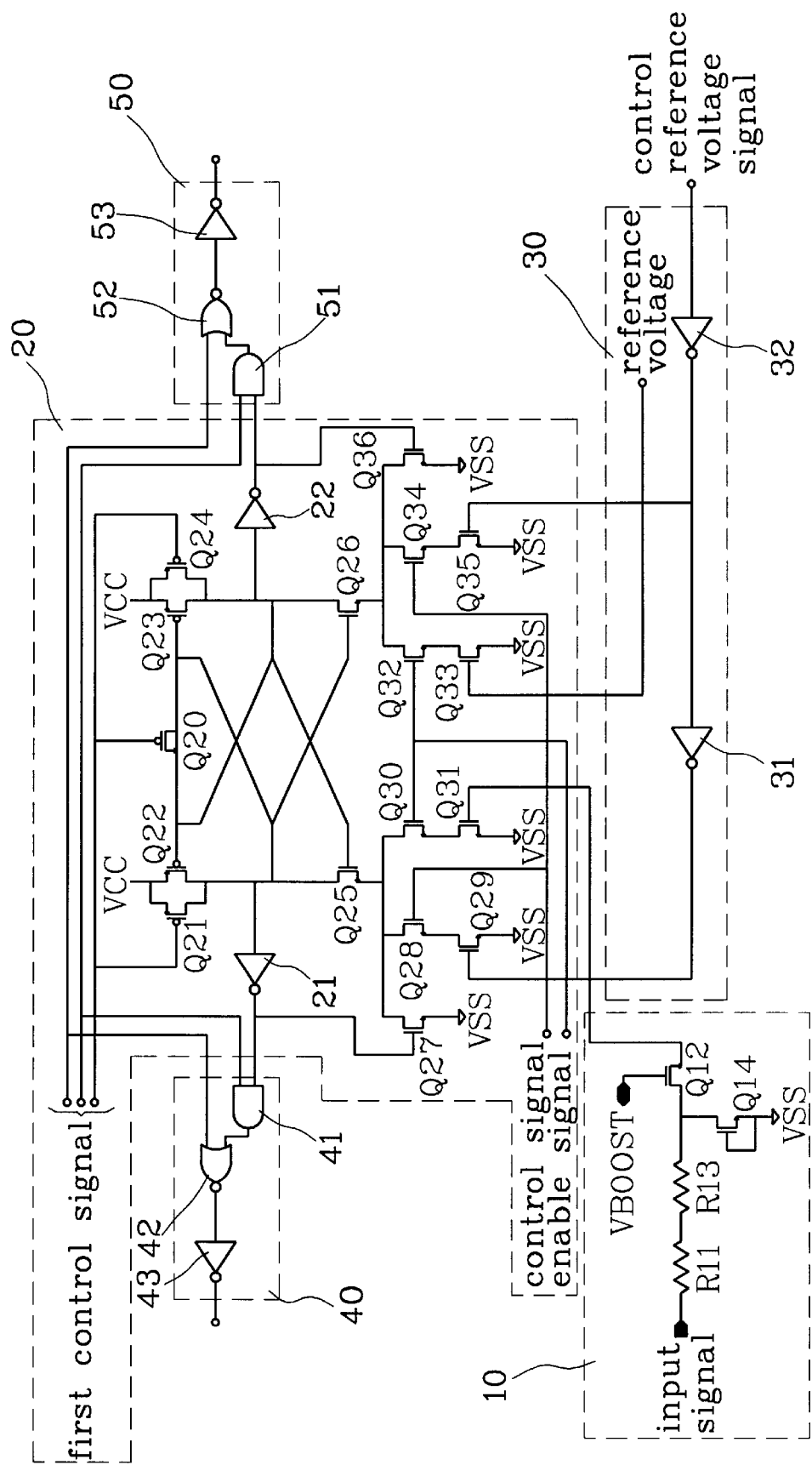
FIG. 4 shows the detailed circuit f the first preferred embodiment of the present invention.

FIG. 4 shows the detailed circuit of the first preferred embodiment of the present invention. The input buffer 10 comprises two resistors R11 and R13, and two transistors Q12 and Q14. Similar to the transmission gate shown in FIG. 2, the gate of the transistor Q12 is connected to a boosting voltage source, and the source and gate of the transistor Q14 are grounded.

The reference circuit 30 comprises two NOT gates 31 and 32 in series connection and receives reference signal/ reference control signals.

As shown in FIG. 4, the control latch 20 comprises a plurality of transistors. The transistors Q20, Q22, Q23, and Q24 are configured to conduct power to the address latch. Therefore, the sources thereof are connected to dc power source. $V_{CC}$ and the gates thereof are connected to the first control signal. The transistors Q20, Q25 and Q26, in conjunction with transistors Q20, Q22, Q23, and Q24, constitute the major part of the latch 20 for latching the address signal. Moreover, the latch 20 is connected to the input terminal of the first and a second output control circuit 40 and 50 through inverter 21 and 22 respectively. The other input terminals of the first and a second output control circuit 40 and 50 are connected to the two outputs of the first control latch 20, respectively, for selection and reference operation. The transistors Q27, Q28, Q29, Q30, Q31, and the transistors Q32, Q33, Q34, Q35, Q36 constitute two sets of circuits, each of which receives an enable signal and a control signal to provide enable and control operation of the output signal of the latch 20.

As also shown in FIG. 4, the first output control circuit 40 comprises an AND gate 41, a NOR gate 42, and a NOT gate 43, and the second output control circuit 50 comprises an AND gate 51, a NOR gate 52, and a NOT gate 53. The input of the AND gate 41 (51) is connected to the output of the NOT gate 21 (22) of the control latch 20 and the reference signal. The two input terminals of the NOR gate 42 (52) are connected to the selection signal of the latch 20 and the output of the AND gate 41 (51). The output of the NOR gate 42 (52) is connected to the input of the NOT gate 43 (53) and outputs the required signal. By the provision of transistors Q12 and Q14, and the boosting voltage source, the level range and the bandwidth of the input signal can be enhanced. Moreover, the inventive input buffer can be advantageously manufactured by mass production.

Figure 5:
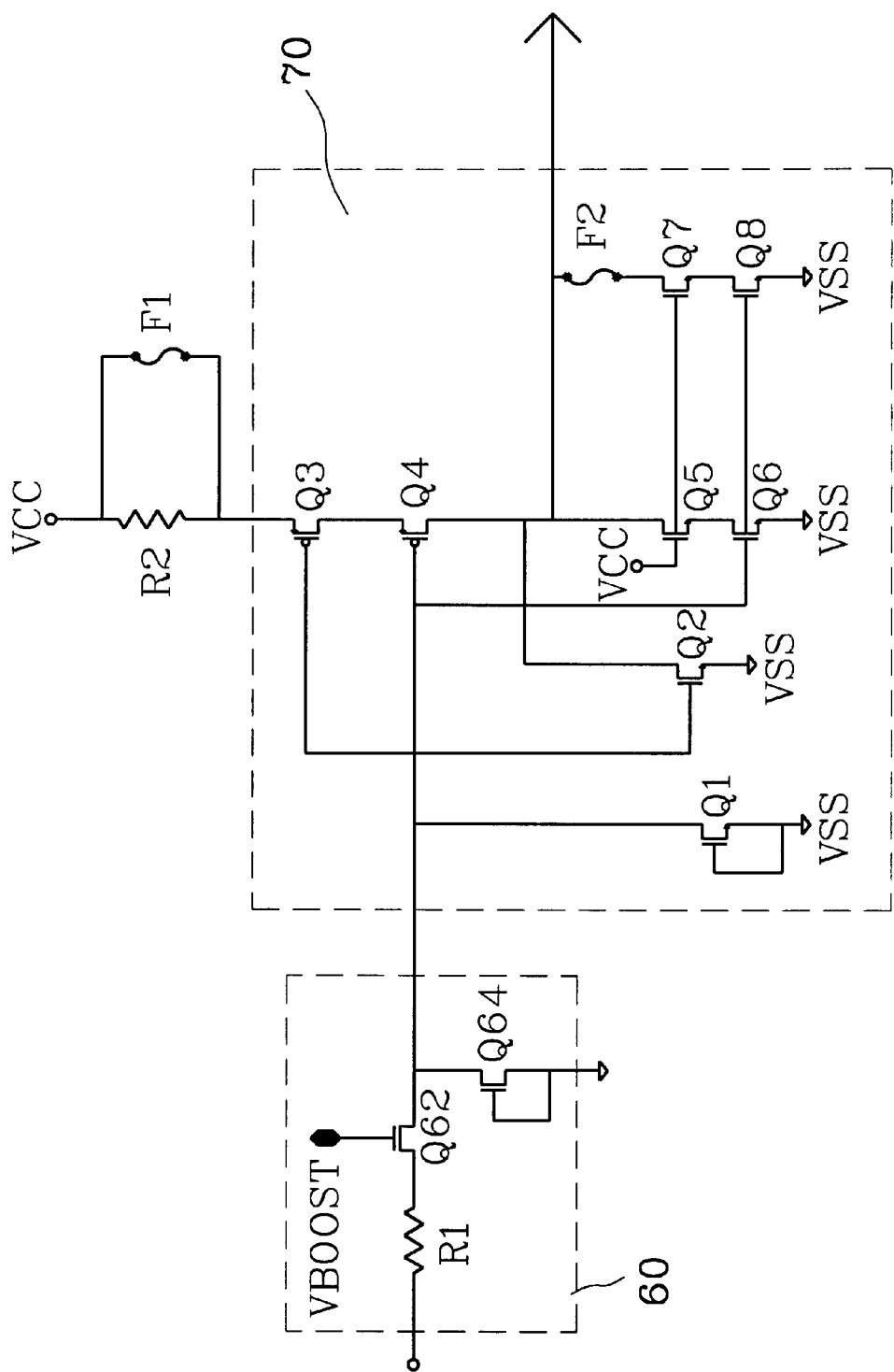
FIG. 5 shows the block diagram of the second preferred embodiment of the present invention.

Moreover, the inventive input buffer having a transmission gate can also be adapted for an inverter-type circuit. FIG. 5 shows the block diagram of the second preferred embodiment of the present invention, wherein $V_{CC}$ denotes the power source and $V_{SS}$ denotes ground. The transmission gate 60 and the inverter 70 can function as an input buffer for various inverter-type digital circuits.

The transmission gate 60 in FIG. 5 comprises transistors Q62 and Q64. Similar to the transmission gate in the first embodiment, the gate of the transistor Q62 is connected to a boosting voltage source $V_{boost}$ to increase the level range and bandwidth of input signal for inverter-type circuit. Moreover, a resistor R1 is provided at the input terminal of the transmission gate 60 and a resistor R2 is connected between the input terminal of the inverter 70 and the power source $V_{CC}$ for providing electrical power.

The inverter 70 has a transistor Q1 at the input terminal thereof for protection purpose, transistors Q3, Q4 in conjunction with transistors Q2, Q5, Q6 performing the inverter function, and transistors Q7, Q8 in parallel with transistors Q5, Q6 for output buffering. Moreover, a fuse F2 is provided at the source (drain) of the transistor Q7 for preventing an excessive output voltage.

To sum up, the inventive input buffer can be advantageously used to increase the range of input signal level and bandwidth for a digital circuit, and prevent the degradation of noise margin due to a decrease an externally-applied voltage.

Although the present invention has been described with reference to the preferred embodiment thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

What is claimed is:

1. An input buffering means for high voltage operation, comprising:
    an input buffer having a transmission gate and at least one resistor arranged to function as an input terminal of said input buffering means, a gate of said transmission gate being connected to a boosting voltage source;
    a control latch circuit connected to the output of said input buffer and arranged to latch the input address signal;
    a reference circuit connected to another input of said control latch circuit to provide a reference signal; and
    two output control circuits connected to two output terminals of said control latch circuit for outputting the address signal.

2. The input buffering means as in claim 1, wherein said output control circuit comprises an AND gate, a NOR gate and a NOT gate.

3. The input buffering means as in claim 1, wherein said transmission gate comprises two transistors.

4. The input buffering means as in claim 1, wherein said control latch circuit receives a first control signal, a control signal, and an enable signal.

5. The input buffering means as in claim 1, wherein said control latch circuit includes a plurality of transistors configured to control a power supply to the control latch.

6. The input buffering means as in claim 1, wherein said control latch circuit includes a plurality of transistors configured to perform a data latch function.

7. The input buffering means as in claim 1, wherein said control latch circuit includes a plurality of transistors configured to receive said enable signal and control signal for performing enable and control functions.

8. The input buffering means as in claim 1, wherein said reference circuit is constituted by two inverters connected in series.

9. The input buffering means as in claim 1, wherein a control reference signal is further connected to the input of said reference circuit.

* * * * *